(12) United States Patent
Okumura et al.

(10) Patent No.: US 6,905,625 B2
(45) Date of Patent: Jun. 14, 2005

(54) PLASMA PROCESSING METHOD AND APPARATUS

(75) Inventors: Tomohiro Okumura, Kadoma (JP); Takayuki Kai, Katano (JP); Yoichiro Yashiro, Kadoma (JP)

(73) Assignee: Matsushita Electric Industrial Co., Ltd., Osaka-fu (JP)

(*) Notice: Subject to any disclaimer, the term of this patent is extended or adjusted under 35 U.S.C. 154(b) by 32 days.

(21) Appl. No.: 10/114,238

(22) Filed: Apr. 3, 2002

(65) Prior Publication Data

US 2002/0153349 A1 Oct. 24, 2002

(30) Foreign Application Priority Data

Apr. 4, 2001 (JP) ........................................ 2001-105443

(51) Int. Cl.[7] .................................................. C23F 1/00
(52) U.S. Cl. ............................ 216/67; 216/68; 216/75; 156/345.48; 118/723 IR; 219/121.43
(58) Field of Search ............................. 216/59, 67, 68, 216/69, 75; 156/345.48; 118/723 IR; 219/121.43

(56) References Cited

U.S. PATENT DOCUMENTS 4,987,284 A * 1/1991 Fujimura et al. ...... 219/121.43

5,690,781 A * 11/1997 Yoshida et al. ........ 156/345.48

FOREIGN PATENT DOCUMENTS

JP 11-111495 * 4/1999 ........... H01L/21/27

* cited by examiner

*Primary Examiner*—Shamim Ahmed
(74) *Attorney, Agent, or Firm*—Wenderoth, Lind & Ponack L.L.P.

(57) ABSTRACT

A plasma processing method includes exhausting the interior of a vacuum chamber while supplying gas into the vacuum chamber, and while maintaining the interior of the chamber at a desired pressure. A high-frequency power of 100 kHz to 100 MHz is applied to a coil provided in the vicinity of a dielectric window provided so as to face a substrate placed on a substrate electrode in the vacuum Thus, plasma is generated in the vacuum chamber to process the substrate or a film on the substrate by the generated plasma while particles which tend to move straight from a surface of the substrate or from a surface of the film on the substrate toward a wall surface of the dielectric window inside the vacuum chamber are kept interrupted by a metal plate.

30 Claims, 6 Drawing Sheets

PLASMA PROCESSING METHOD AND APPARATUS

BACKGROUND OF THE PRESENT INVENTION

The present invention relates to a plasma processing method and apparatus, such as an etching method and apparatus, to be used for manufacture of semiconductors or other electron equipment and micromachines.

For manufacture of semiconductors or other electron equipment and micromachines, demands for etching techniques related to refractory metal films have been increasing year after year.

For example, in the field of semiconductor memories (storage devices), although countermeasures for increases in the capacitance of memory capacitors have hitherto been given by changing the memory capacitor structure, it has become difficult to secure demanded capacitances only by the structure change with progress of miniaturizing. Due to this, ceramic base oxides having high dielectric constants such as barium/strontium titanate, lead zirconium titanate, and bismuth/strontium tantalate have come to be used as materials for capacitor capacitance. Since elimination of oxygen from these ceramic base oxides would cause their characteristics to largely deteriorate, such materials exhibiting low reaction with oxygen as ruthenium, platinum, iridium, and rhodium are used as materials for capacitor electrodes. Forming microfine patterns by using these materials requires etching techniques for those materials.

Moreover, not only for. Si-based semiconductors but also for compound semiconductors, there has arisen a need for an etching process that contact holes are formed in an insulator film with a refractory metal film used as an undercoat film. In this case, although the insulator film is targeted for the etching, the refractory metal, which is the undercoat film, also would be etched to some extent in overetching.

Figure 7:
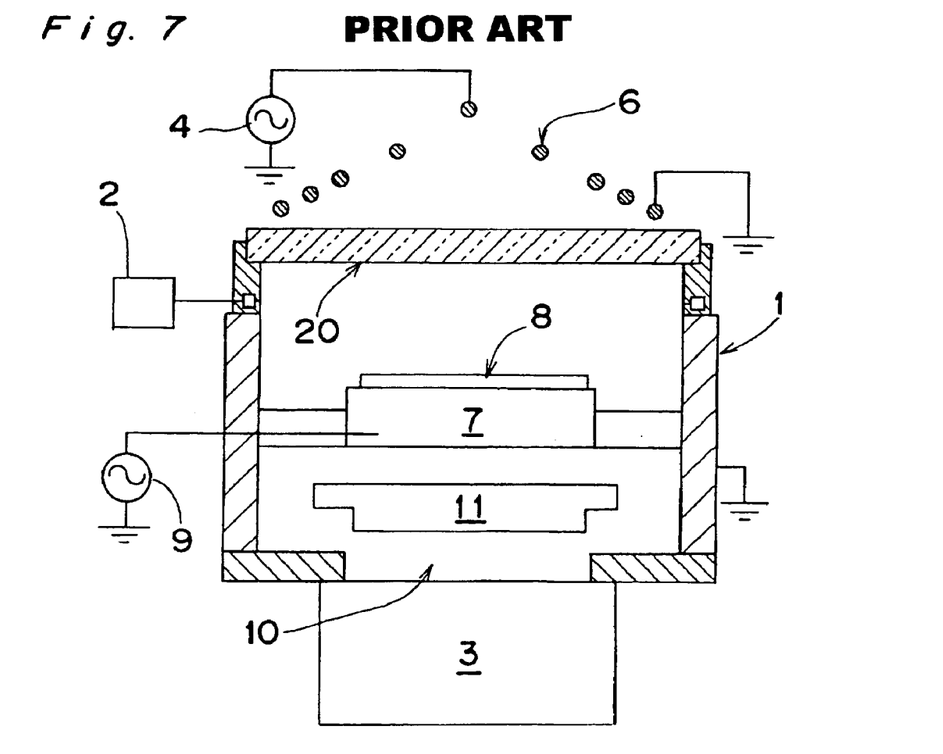
FIG. 7 is a sectional view showing the constitution of an etching apparatus used in the prior art example.

An etching using an inductively coupled plasma source as an example of the prior-art etching method is explained below with reference to FIG. 7. Referring to FIG. 7, while a vacuum chamber 1 is maintained at a specified internal pressure by exhausting the vacuum chamber 1 with a turbo-molecular pump 3 serving as an exhauster and simultaneously supplying a specified gas from gas supply equipment 2 into the vacuum chamber 1, a high-frequency power of 13.56 MHz is supplied to a coil 6 provided on a dielectric plate 20 by means of a coil-use high-frequency power supply 4, by which plasma is generated in the vacuum chamber 1, allowing the etching on a substrate 8 placed on a substrate electrode 7 to be achieved. Further, a substrate-electrode use high-frequency power supply 9 for supplying a high-frequency power of 400 kHz to the substrate electrode 7 is provided, allowing ion energy reaching the substrate 8 to be controlled.

The turbo-molecular pump 3 and an exhaust port 10 are disposed just under the substrate electrode 7, and a pressure-controlling valve 11 for maintaining the vacuum chamber 1 at the specified pressure is an up-down valve located just under the substrate electrode 7 and just over the turbo-molecular pump 3.

With an etching apparatus having such a constitution, an iridium film can be etched under the conditions of an $Ar/Cl_2$ of 260/20 sccm, a pressure of 0.3 Pa, and an ICP (coil power)/BIAS (substrate-electrode power) of 1500/400 W.

Further, a silicon oxide film on a gold film can be etched under the conditions of an $Ar/CHF_3$ of 270/30 sccm, a pressure of 2.5 Pa, and an ICP/BIAS of 1500/600 W.

Figure 8:
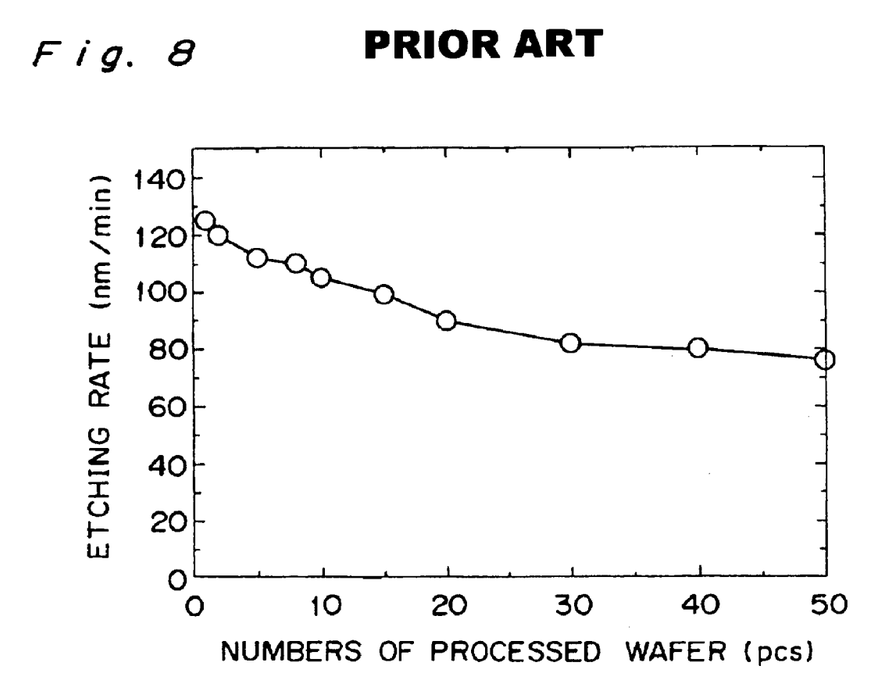
FIG. 8 is a graph showing variations in the etching rate in the prior art example.

However, in the etching of iridium described in the prior art example, which consists mainly of physical etching, an electrically conductive iridium thin film would deposit on the surface of the dielectric plate 20. Therefore, a high-frequency electromagnetic field generated in the vacuum chamber 1 as a result of supplying high-frequency power to the coil 6 would be gradually weakened, and a decline of the etching rate would occur as an issue as shown in FIG. 8.

Figure 9:
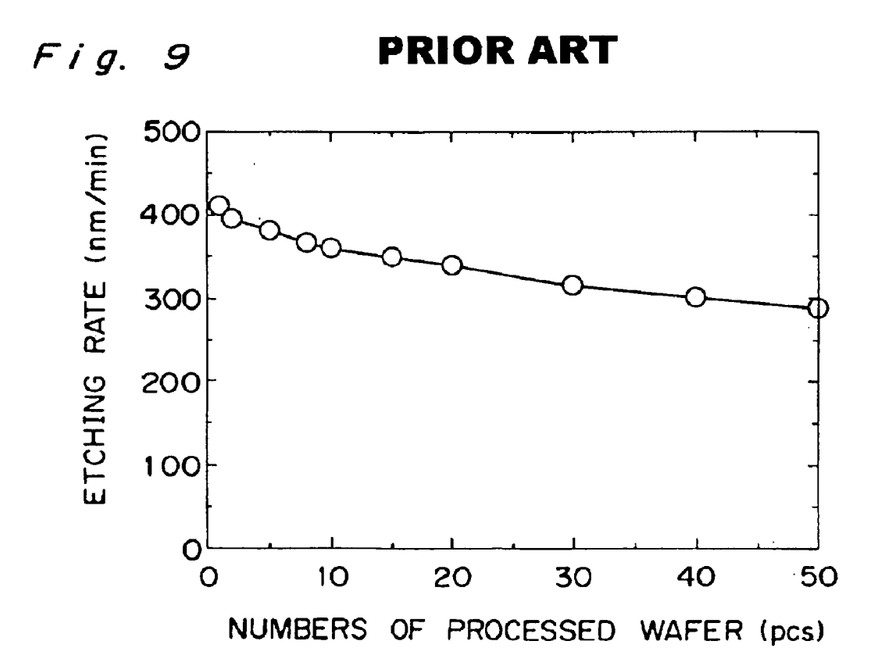
FIG. 9 is a graph showing variations in the etching rate in another prior art example.
Figure 10:
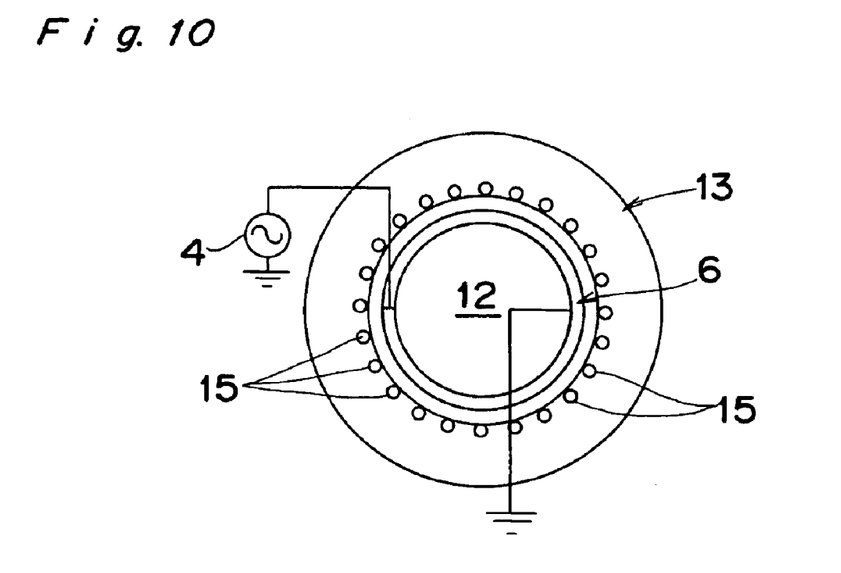
FIG. 10 is a plan view of the etching apparatus of FIG. 1.

Also, in the etching of a silicon oxide film described in the prior art example, in which gold forming an undercoat film would be etched to some extent in overetching, where the etching of gold also consists mainly of physical etching, an electrically conductive gold thin film would be deposited on the surface of the dielectric plate 20. Therefore, a high-frequency electromagnetic field generated in the vacuum chamber 1 as a result of supplying high-frequency power to the coil 6 would be gradually weakened, and a decline of the etching rate would occur as an issue as shown in FIG. 9.

SUMMARY OF THE PRESENT INVENTION

The present invention having been accomplished in view of these and other prior-art issues, an object of the present invention is to provide a plasma processing method and apparatus capable of achieving uniform plasma processing and ensuring a stable etching rate.

In accomplishing these and other aspects, according to a first aspect of the present invention, there is provided a plasma processing method comprising: exhausting the interior of a vacuum chamber while supplying gas into the vacuum chamber; and, while maintaining the interior of the vacuum chamber at a pressure, applying a high-frequency power of 100 kHz to 100 MHz to a coil provided in a vicinity of a dielectric window provided so as to face a substrate placed on a substrate electrode in the vacuum chamber. Thus, plasma is generated in the vacuum chamber to process the substrate or a film on the substrate by the generated plasma while particles which tend to move straight from a surface of the substrate or from a surface of the film on the substrate toward a wall surface of the dielectric window inside the vacuum chamber are interrupted (blocked) by a metal plate.

According to a second aspect of the present invention, there is provided a plasma processing method according to the first aspect, wherein when the plasma is generated inside the vacuum chamber, the high-frequency power of 100 kHz to 100 MHz is applied to the coil provided inside a dielectric cylinder serving as the dielectric window and outside a vacuum chamber.

According to a third aspect of the present invention, there is provided a plasma processing method according to the first or second aspect, wherein the plasma processing is a process of etching the substrate or the film on the substrate.

According to a fourth aspect of the present invention, there is provided a plasma processing method according to the first or second aspect, wherein the plasma processing is a process of etching a refractory metal film on the substrate.

According to a fifth aspect of the present invention, there is provided a plasma processing method according to the first or second aspect, wherein the plasma processing is a process of etching a thin film formed on a refractory metal film on the substrate.

According to a sixth aspect of the present invention, there is provided a plasma processing method according to the fourth or fifth aspect, wherein the refractory metal film is a film containing at least one element of iridium, rhodium, ruthenium, platinum, gold, copper, rhenium, bismuth, strontium, barium, zirconium, lead, and niobium.

According to a seventh aspect of the present invention, there is provided a plasma processing method according to the second aspect, wherein the high-frequency power of 100 kHz to 100 MHz is applied to the coil provided outside the vacuum chamber on a dielectric cylinder serving as the dielectric window in a state in which a first metal plate provided at a bottom portion of the dielectric cylinder inside the vacuum chamber is connected to a second metal plate provided at an upper portion of the dielectric cylinder on its side opposite to the bottom portion inside the vacuum chamber by means of a metal rod or bolt extending through a penetration hole provided along an axis of the dielectric cylinder while the dielectric cylinder is fixed by being sandwiched between the first metal plate and the second metal plate.

According to an eighth aspect of the present invention, there is provided a plasma processing method according to the second aspect, wherein the high-frequency power of 100 kHz to 100 MHz is applied to the coil provided outside the vacuum chamber on a dielectric cylinder serving as the dielectric window in a state in which a first metal plate provided at a bottom portion of the dielectric cylinder inside the vacuum chamber is connected to a second metal plate provided at an upper portion of the dielectric cylinder on its side opposite to the bottom portion inside the vacuum chamber by means of a metal fastener such as a rod or bolt disposed outside the vacuum chamber on the dielectric cylinder while the dielectric cylinder is fixed by being sandwiched between the first metal plate and the second metal plate.

According to a ninth aspect of the present invention, there is provided a plasma processing method according to the seventh or eighth aspect, wherein the metal rod or bolt, the first metal plate, and the second metal plate are at a ground potential.

According to a 10th aspect of the present invention, there is provided a plasma processing method according to the seventh or eighth aspect, wherein the processing is carried out in a state in which a line segment interconnecting an arbitrary point on a vacuum-side wall surface of the dielectric cylinder and an arbitrary point on a surface of the substrate is interrupted by the first metal plate provided at the bottom of the dielectric cylinder.

According to an 11th aspect of the present invention, there is provided a plasma processing method according to the seventh or eighth aspect, wherein a diameter of the first metal plate is 1 to 1.5 times larger than a diameter of the substrate electrode, and a diameter of the second metal plate is 1.6 to 3 times larger than a diameter of the substrate electrode.

According to a 12th aspect of the present invention, there is provided a plasma processing method according to the seventh or eighth aspect, wherein a distance between the first metal plate and the substrate electrode is 40 mm to 150 mm.

According to a 13th aspect of the present invention, there is provided a plasma processing method according to the first or second aspect, wherein the vacuum chamber has a pressure not more than 10 Pa.

According to a 14th aspect of the present invention, there is provided a plasma processing method according to the first or second aspect, wherein the vacuum chamber has a pressure not more than 3 Pa.

According to a 15th aspect of the present invention, there is provided a plasma processing apparatus comprising: a vacuum chamber; gas supply equipment for supplying gas into the vacuum chamber; exhaust equipment for exhausting the vacuum chamber; a pressure-controlling valve for maintaining the vacuum chamber at an internal pressure; a substrate electrode for placing thereon a substrate in the vacuum chamber; a dielectric window provided so as to face the substrate electrode; a coil provided in a vicinity of the dielectric window; and high-frequency power supply equipment capable of supplying high-frequency power of 100 kHz to 100 MHz to the coil. A line segment interconnecting an arbitrary point on a vacuum-side wall surface of the dielectric window and an arbitrary point on a surface of the substrate is interrupted by a metal plate.

According to a 16th aspect of the present invention, there is provided a plasma processing apparatus comprising: a vacuum chamber; gas supply equipment for supplying gas into the vacuum chamber; exhaust equipment for exhausting the vacuum chamber; a pressure-controlling valve for maintaining the vacuum chamber at an internal pressure; a substrate electrode for placing thereon a substrate in the vacuum chamber; a dielectric cylinder provided so as to face the substrate electrode; a coil provided inside the dielectric cylinder and outside the vacuum chamber; and high-frequency power supply equipment capable of supplying high-frequency power of 100 kHz to 100 MHz to the coil.

According to a 17th aspect of the present invention, there is provided a plasma processing apparatus according to the 16th aspect, further comprising: a first metal plate provided at a first-side bottom of the dielectric cylinder facing the substrate electrode; and a second metal plate provided at the other (second) side bottom of the dielectric cylinder not facing the substrate electrode. The first metal plate is connected to the second metal plate by means of a metal rod or a bolt extending through a penetration hole provided along a cylinder axis of the dielectric cylinder while the dielectric cylinder is fixed by being sandwiched between the first metal plate and the second metal plate.

According to an 18th aspect of the present invention, there is provided a plasma processing apparatus according to the 16th aspect, further comprising: a first metal plate provided at a one-side bottom of the dielectric cylinder facing the substrate electrode; and a second metal plate provided at the other side bottom of the dielectric cylinder not facing the substrate electrode. The first metal plate is connected to the second metal plate by means of a metal rod or a bolt provided through a space inside the dielectric cylinder while the dielectric cylinder is fixed by being sandwiched between the first metal plate and the second metal plate.

According to a 19th aspect of the present invention, there is provided a plasma processing apparatus according to the 17th or 18th aspect, wherein the metal rod or bolt, the first metal plate, and the second metal plate are at a ground potential.

According to a 20th aspect of the present invention, there is provided a plasma processing apparatus according to the 17th or 18th aspect, wherein a line segment interconnecting an arbitrary point on a vacuum-side wall surface of the dielectric cylinder and an arbitrary point on a surface of the substrate is interrupted by the first metal plate provided at the bottom of the dielectric cylinder.

According to a 21st aspect of the present invention, there is provided a plasma processing apparatus according to the 17th or 18th aspect, wherein a diameter of the first metal plate is 1 to 1.5 times larger than a diameter of the substrate electrode and a diameter of the second metal plate is 1.6 to 3 times larger than a diameter of the substrate electrode.

According to a 22nd aspect of the present invention, there is provided a plasma processing apparatus according to the 17th or 18th aspect, wherein a distance between the first metal plate and the substrate electrode is 40 mm to 150 mm.

According to a 23rd aspect of the present invention, there is provided an etching method comprising: maintaining the interior of a vacuum chamber at a pressure by exhausting the vacuum chamber while supplying gas into the vacuum chamber; and applying a high-frequency power of 100 kHz to 100 MHz to a coil provided inside a dielectric cylinder and outside the vacuum chamber provided so as to face a substrate placed on a substrate electrode in the vacuum chamber, thus generating plasma in the vacuum chamber so as to etch a refractory metal film on the substrate.

According to a 24th aspect of the present invention, there is provided an etching method comprising: maintaining the interior of a vacuum chamber at a pressure by exhausting the vacuum chamber while supplying gas into the vacuum chamber; and applying a high-frequency power of 100 kHz to 100 MHz to a coil provided inside a dielectric cylinder and outside the vacuum chamber provided so as to face a substrate placed on a substrate electrode in the vacuum chamber, thus generating plasma in the vacuum chamber so as to etch a thin film formed on a refractory metal film on the substrate.

According to a 25th aspect of the present invention, there is provided an etching method according to the 23rd or 24th aspect, wherein the refractory metal film is a film containing at least one element of iridium, rhodium, ruthenium, platinum, gold, copper, rhenium, bismuth, strontium, barium, zirconium, lead, and niobium.

According to a 26th aspect of the present invention, there is provided an etching method according to the 23rd or 24th aspect, wherein the etching is carried out in a state in which a first metal plate provided at a first-side bottom of the dielectric cylinder facing the substrate electrode is connected to a second metal plate provided at the other (second) side bottom of the dielectric cylinder not facing the substrate electrode. The connection of the first metal plate to the second metal plate is by a metal rod or a bolt extending through a penetration hole provided along a cylinder axis of the dielectric cylinder while the dielectric cylinder is fixed by being sandwiched between the first metal plate and the second metal plate.

According to a 27th aspect of the present invention, there is provided an etching method according to the 23rd or 24th aspect, wherein the etching is carried out in a state in which a first metal plate provided at a first-side bottom of the dielectric cylinder facing the substrate electrode is connected to a second metal plate provided at the other (second) side bottom of the dielectric cylinder not facing the substrate electrode. The connection of the first metal plate to the second metal plate is by a metal rod or a bolt provided in a space inside the dielectric cylinder while the dielectric cylinder is fixed by being sandwiched between the first metal plate and the second metal plate.

According to a 28th aspect of the present invention, there is provided an etching method according to the 26th or 27th aspect, wherein the metal rod or bolt, the first metal plate, and the second metal plate are at a ground potential.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Before the description of the present invention proceeds, it is to be noted that like parts are designated by like reference numerals throughout the accompanying drawings.

Hereinbelow, a first embodiment of the present invention is described with reference to FIGS. 1 to 3 and 10.

Figure 1:
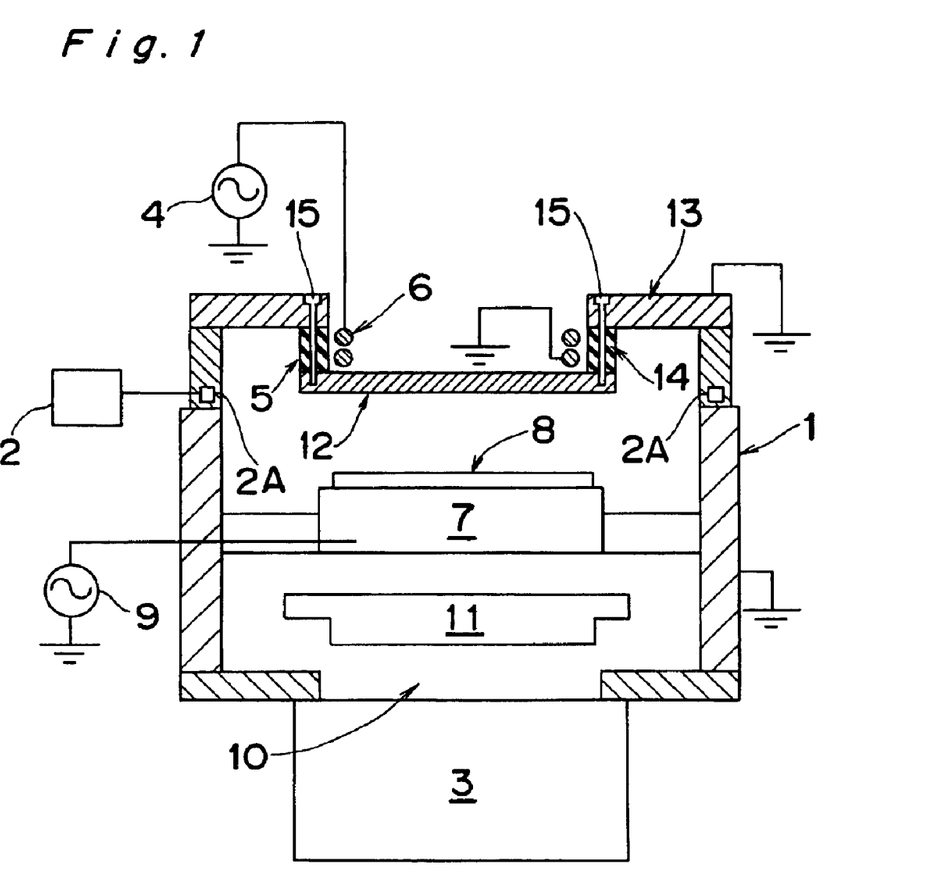
FIG. 1 is a sectional view showing the constitution of an etching apparatus used in a first embodiment of the present invention.

FIG. 1 shows a sectional view of an etching apparatus as an example of a plasma processing apparatus used in a first embodiment of the present invention. Referring to FIG. 1, while a vacuum chamber 1 is maintained at a specified internal pressure by exhausting the vacuum chamber 1 with a turbo-molecular pump 3 serving as an exhauster and simultaneously supplying a specified gas from nozzles 2A of gas supply equipment 2 into the vacuum chamber 1, a high-frequency power of 13.56 MHz is supplied by means of coil-use high-frequency power supply equipment 4 to a coil 6 provided inside a dielectric cylinder 5 which serves as one example of a dielectric window and is formed of glass or ceramics, such as quartz glass, alumina, aluminum nitride or silicon nitride ($SiN_4$). Thus, plasma is generated in the vacuum chamber 1, allowing the etching on an object such as a substrate 8 or a thin film thereon placed on a substrate electrode 7 to be performed. Further, substrate-electrode use high-frequency power supply equipment 9 for supplying high-frequency power of 400 kHz to the substrate electrode 7 is provided, allowing ion energy reaching the substrate 8 to be controlled. Examples of the thin films on the substrate 8 are a silicon oxide film, a silicon nitride film, etc.

Figure 2:
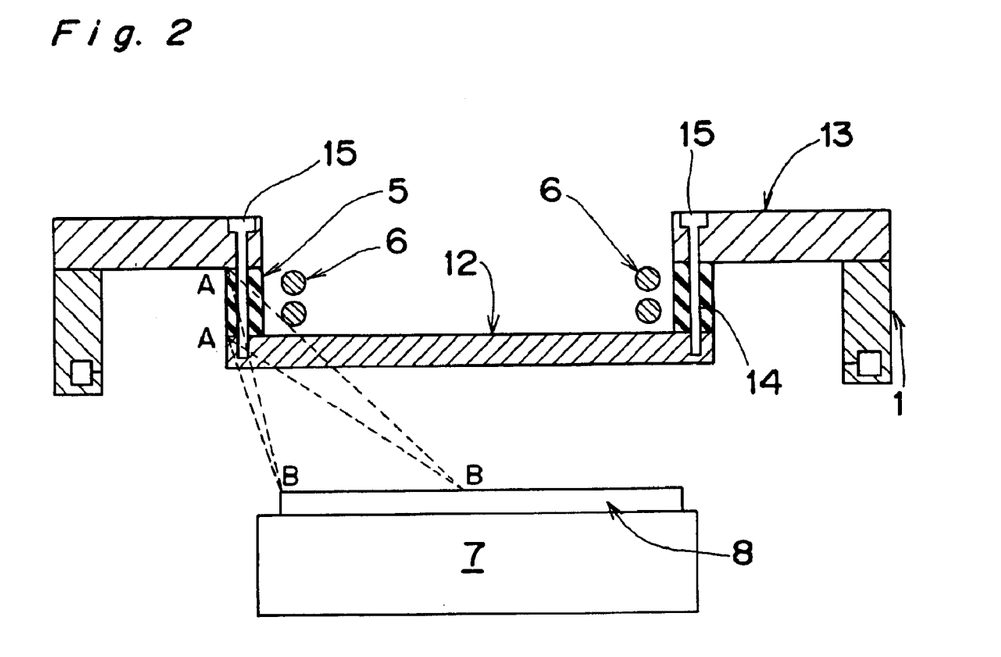
FIG. 2 is an enlarged and partially sectional view showing the constitution of the etching apparatus used in the first embodiment of the present invention.

The turbo-molecular pump 3 and an exhaust port 10 are disposed just under the substrate electrode 7, and a pressure-controlling valve 11 for maintaining the vacuum chamber 1 at the specified pressure is an up-down valve located just under the substrate electrode 7 and just over the turbo-molecular pump 3. Thus, the pressure-controlling valve 11 moves up and down to control the pressure in the vacuum chamber 1 to set to the pressure at specified pressure. A first solid metal plate 12 made of aluminum and having an alumite-coated surface, for example, is provided at a first-side bottom of the dielectric cylinder 5 facing the substrate electrode 7, and a second metal plate 13 made of aluminum and having an alumite-coated surface as an example is provided at the other (second) side of the dielectric cylinder 5 not facing the substrate electrode 7. The first metal plate 12 is connected to the second metal plate 13 plural bolts 15 made of stainless as an example and extending through penetration holes 14 provided in the dielectric cylinder 5 along the cylinder axis of the dielectric cylinder 5. The dielectric cylinder 5 is fixed by being sandwiched between the first metal plate 12 and the second metal plate 13. That is, as shown in FIG. 2, the dielectric cylinder 5 is located on the outer edge surface of the first metal plate 12, and the outer edge of the first metal plate
the inner edge of the dielectric cylinder 5 are located on the inner edge of the second metal plate 13 while the bolts 15 are connected between the first metal plate 12 and the second metal plate 13 through the dielectric cylinder 5. The bolts 15, the first metal plate 12, and the second metal plate 13 are at the ground potential.

Also, as shown in FIG. 2, a straight line segment interconnecting an arbitrary point A on the vacuum-side wall surface of the dielectric cylinder 5 and an arbitrary point B on the substrate surface is interrupted (intersected) by the first metal plate 12 provided at the bottom of the dielectric cylinder 5. That is, when plasma processing is carried out, particles which tend to move straight from a surface of the substrate 8 or from a surface of the film on the substrate 8 toward a wall surface of the dielectric cylinder 5 inside the vacuum chamber 1 through the plasma processing are interrupted (blocked) by the first metal plate 12, thus preventing deposition of a thin film on the dielectric cylinder 5.

Figure 3:
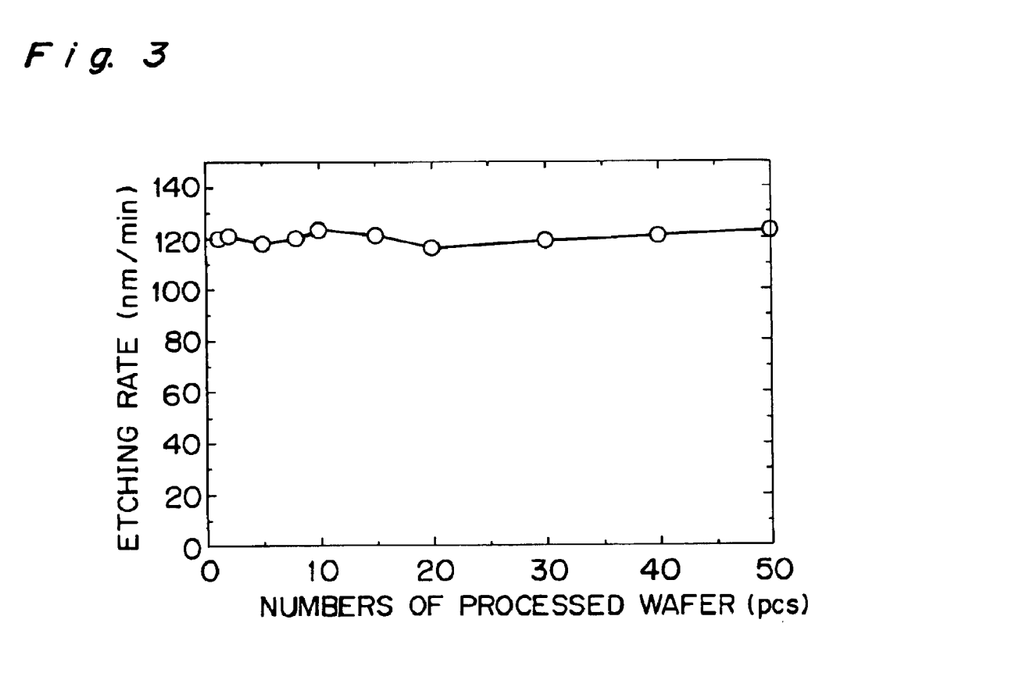
FIG. 3 is a graph showing variations in the etching rate in the first embodiment of the present invention.

With the etching apparatus having such a constitution, an iridium film was etched under the conditions of an $Ar/Cl_2$ of 260/20 sccm, a pressure of 0.3 Pa, and an ICP (coil power)/BIAS (substrate-electrode power) of 1500/1400 W. A transition of etching rate is shown in FIG. 3. As apparent from FIG. 3, such declines of etching rate as seen in the prior art example have been eliminated.

The reason why a stable etching rate has been ensured as shown above can be that the iridium thin film is no longer deposited on the surface of the dielectric cylinder 5 so that the high-frequency electromagnetic field generated in the vacuum chamber 1 as a result of supplying the high-frequency power to the coil 6 has become stable in strength.

Next, a second embodiment of the present invention is described with reference to FIGS. 4 to 6.

Figure 4:
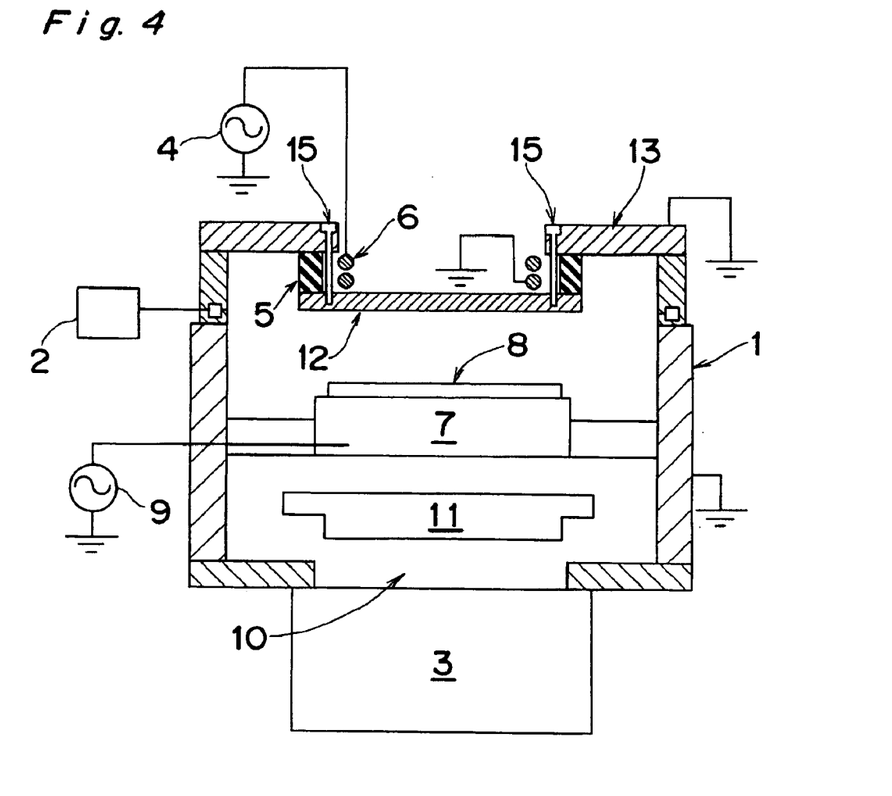
FIG. 4 is a sectional view showing the constitution of an etching apparatus used in a second embodiment of the present invention.

FIG. 4 shows a sectional view of an etching apparatus used in the second embodiment of the present invention. Referring to FIG. 4, while a vacuum chamber 1 is maintained at a specified internal pressure by exhausting the vacuum chamber 1 with a turbo-molecular pump 3 serving as an exhauster and simultaneously supplying a specified gas from gas supply equipment 2 into the vacuum chamber 1, a high-frequency power of 13.56 MHz is supplied by means of coil-use high-frequency power supply equipment 4 to a coil 6 provided inside a dielectric cylinder 5 serving as one example of a dielectric window. Thus, plasma is generated in the vacuum chamber 1, allowing the etching on a substrate 8 or a thin film thereon placed on a substrate electrode 7 to be performed. Further, a substrate-electrode use high-frequency power supply 9 for supplying a high-frequency power of 400 kHz to the substrate electrode 7 is provided, allowing ion energy reaching the substrate 8 to be controlled. Examples of the thin films on the substrate 8 are a silicon oxide film, a silicon nitride film, etc.

The turbo-molecular pump 3 and an exhaust port 10 are disposed just under the substrate electrode 7, and a pressure-controlling valve 11 for maintaining the vacuum chamber 1 at the specified pressure is an up-down valve located just under the substrate electrode 7 and just over the turbo-molecular pump 3. Thus, the pressure-controlling valve 11 moves up and down to control the pressure the vacuum chamber 1 to set to the specified pressure. Thus, the pressure-controlling valve 11 moves up and down to control the pressure in the vacuum chamber 1 to set the pressure at the specified pressure.

A first metal plate 12 is provided at a first-side bottom of the dielectric cylinder 5 facing the substrate electrode 7, and a second metal plate 13 is provided at the other (second) side of the dielectric cylinder 5 not facing the substrate electrode 7. The first metal plate 12 is connected to the second metal plate 13 by plural bolts 15 provided through a space inside the dielectric cylinder 5 and outside the vacuum chamber 1, and the dielectric cylinder 5 is fixed by being sandwiched between the first metal plate 12 and the second metal plate 13. That is, as shown in FIG. 5, the dielectric cylinder 5 is located on the outer edge of the first metal plate 12, and the outer edge of the first metal plate 12 and the inner edge of the dielectric cylinder 5 are located outside of the inner edge of the second metal plate 13 while the bolts 15 are connected between the first metal plate 13 and the second metal plate 12 but not through the dielectric cylinder 5. The bolts 15, the first metal plate 12, and the second metal plate 13 are at the ground potential.

Figure 5:
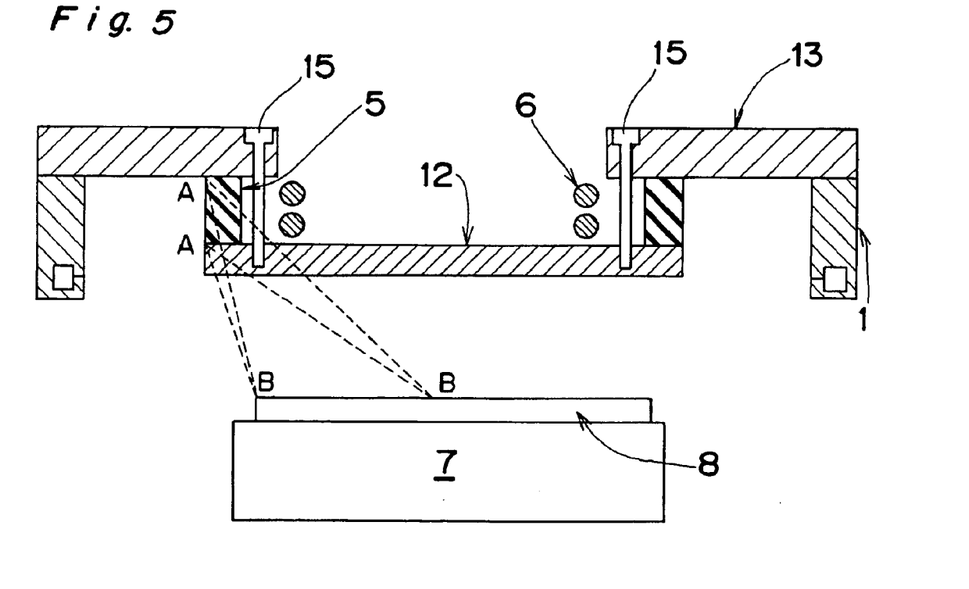
FIG. 5 is an enlarged and partially sectional view showing the constitution of the etching apparatus used in the second embodiment of the present invention.
Figure 6:
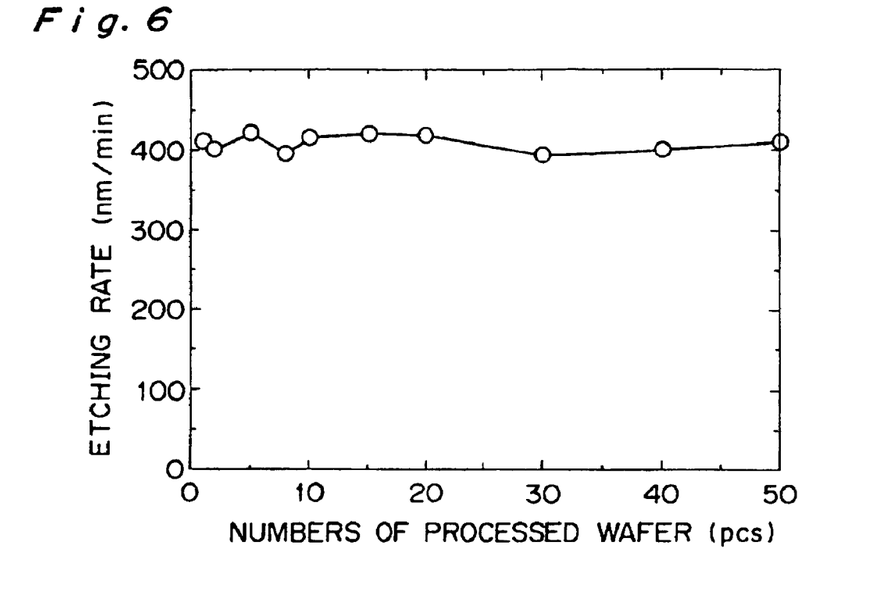
FIG. 6 is a graph showing variations in the etching rate in the second embodiment of the present invention.

Also, as shown in FIG. 5, a line segment interconnecting an arbitrary point A on the vacuum-side wall surface of the dielectric cylinder 5 and an arbitrary point B on the substrate surface is interrupted (intersected) by the first metal plate 12 provided at the bottom of the dielectric cylinder 5. That is, when plasma processing is carried out, particles which tend to move straight from a surface of the substrate 8 or from a surface of the film on the substrate 8 toward a wall surface of the dielectric cylinder 5 inside the vacuum chamber 1 through the plasma processing are interrupted (blocked) by the first metal plate 12, thus preventing deposition of a thin film on the dielectric cylinder 5.

With the etching apparatus having such a constitution, a silicon oxide film on a gold film was etched under the conditions of an $Ar/CHF_3$ of 270/30 sccm, a pressure of 2.5 Pa, and an ICP/BIAS of 1500/600 W. A transition of etching rate is shown in FIG. 6. As apparent from FIG. 6, such declines of etching rate as seen in the prior art example have been eliminated.

The reason why a stable etching rate has been ensured as explained above can be that the gold thin film is no longer deposited on the surface of the dielectric cylinder 5, so that the high-frequency electromagnetic field generated in the vacuum chamber 1 as a result of supplying the high-frequency power to the coil 6 has become stable in strength.

The above-described embodiments of the present invention show only part of many variations in terms of the configuration of the vacuum chamber, the configuration and placement of the coil and the dielectric cylinder or the like by way of example out of the scope of application of the present invention. It is needless to say that wide variations in addition to the examples explained hereinabove are possible in the application of the present invention.

Although the above embodiments of the present invention have been described about the etching of an iridium film and the etching of a silicon oxide film formed on a gold film, the present invention is useful for the etching of a refractory metal film and the etching of a thin film formed on a refractory metal film. Among such aspects of etching, this etching method is useful particularly for cases where the refractory metal film is a film containing at least one element of iridium, rhodium, ruthenium, platinum, gold, copper, rhenium, bismuth, strontium, barium, zirconium, lead, and niobium.

The above embodiments of the present invention have been described for a case where the first metal plate is provided at a first-side bottom of the dielectric cylinder facing the substrate electrode while the second metal plate is provided at the other (second) side of the dielectric cylinder not facing the substrate electrode, wherein the first metal plate is connected to the second metal plate by bolts extending through penetration holes provided in the dielectric cylinder along the cylinder axis of the dielectric cylinder while the dielectric cylinder is fixed by being sandwiched between the first and second metal plates, in which state the etching is performed. Alternatively, the invention has been described for a case where the first metal plate is provided at a first-side bottom of the dielectric cylinder facing the substrate electrode while the second metal plate is provided at the other (second) side of the dielectric cylinder not facing the substrate electrode, wherein the first metal plate is connected to the second metal plate by bolts provided through a space inside the dielectric cylinder while the dielectric cylinder is fixed by being sandwiched between the first and second metal plates, in which state the etching is performed. However, various constitutions other than these are possible, of course. For example, the first and second metal plates may be connected to each other by using a metal rod instead of the bolt.

Also, the above embodiments of the present invention have been described for a case where the bolt, the first metal plate, and the second metal plate are at the ground potential. Since such a constitution allows the capacitive coupling between the coil and the plasma to be suppressed, self-biased potential is unlikely to occur to the surface of the dielectric cylinder, offering an advantage that the surface of the dielectric cylinder is less etched. In addition, for prevention of inductive heating at the bolt or the metal rod, it is desirable that the bolt or the metal rod be coated or plated with a low-resistivity film.

Also, the above embodiments of the present invention have been described for a case where a line segment interconnecting an arbitrary point on the vacuum-side wall surface of the dielectric cylinder and an arbitrary point on the substrate surface is interrupted by the first metal plate provided at the bottom of the dielectric cylinder, in which state the etching is performed. However, this interruption does not necessarily need to be perfect, and the design may be given some degree of freedom within such a scope as declines of etching rate do not occur.

Also, the above embodiments of the present invention have been described fir a case where the turbo-molecular pump for exhausting the vacuum chamber is disposed just under the substrate electrode while the pressure-controlling valve for maintaining the vacuum chamber at a specified pressure is an up-down valve located just under the substrate electrode and just over the turbo-molecular pump. However, the present invention is useful also for cases where the turbo-molecular pump 3 is disposed at locations other than just under the substrate electrode 7 while the pressure-controlling valve 11 is disposed at locations other than just under the substrate electrode 7 and comprises a valve other than an up-down valve. However, the embodiments of the present invention, in which gas exhaust is done isotropically, offer an advantage that the etching can be achieved uniformly.

Further, although the description has been made for cases where the internal pressure of the vacuum chamber is 0.3 Pa and 2.5 Pa, the method of the present invention is useful for cases where the internal pressure of the vacuum chamber is not more than 10 Pa since the lower the internal pressure of the vacuum chamber is, the larger the part that the physical etching forms. The method of the present invention is useful particularly for cases where the internal pressure of the vacuum chamber is not more than 1 Pa.

Further, although the description has been made for a case where the frequency of the high-frequency power applied to the coil is 13.56 MHz, the method of the present invention allows high-frequency powers of 100 kHz to 100 MHz to be used for the etching at low pressure, thus being useful for all of those regions.

Further, although the description has been made for a case where the frequency of the high-frequency power applied to the substrate electrode is 400 kHz, the method of the present invention, needless to say, allows other frequencies, for example, high-frequency powers of 100 kHz to 100 MHz to be used for the control of ion energy reaching the substrate.

The dielectric cylinder 5 may be structured longitudinally longer. In this case, since the region for high dissociation of plasma occupies an increased volume, there can be obtained a characteristic that active particles of further dissociated composition can be made to act on the substrate 8.

Figure 11:
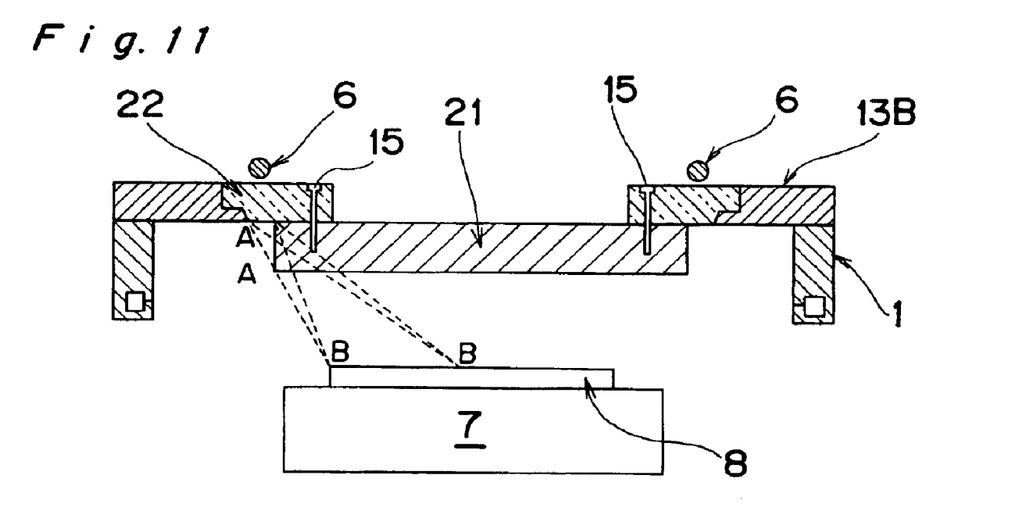
FIG. 11 is an enlarged and partially sectional view showing the constitution of an etching apparatus used in a third embodiment of the present invention.

In an etching apparatus of a third embodiment of the present invention, a dielectric ring 22 instead of the dielectric cylinder 5 which can be used as a dielectric window is fitted into a hole of a second metal plate 13B so as to locate the dielectric ring 22 as an inner edge of the second metal plate 13B. The inner edge of the dielectric ring 22 is brought into contact with the outer edge of a first metal plate 21 at the lower side of the dielectric ring 22 while the inner edge of the dielectric ring 22 and the outer edge of the first metal plate 21 are directly connected with bolts 15. The coil 6 is provided outside the dielectric ring 22.

In such a construction, as shown in FIG. 11, a line segment interconnecting an arbitrary point A on the vacuum-side wall surface of the dielectric ring 22 and an arbitrary point B on the substrate surface is interrupted by the first metal plate 21 provided on the lower side of the dielectric ring 22. That is, when plasma processing is carried out, particles which tend to move straight from a surface of the substrate 8 or from a surface of the film on the substrate 8 toward a wall surface of the dielectric ring 22 inside the vacuum chamber 1 through the plasma processing can be interrupted (blocked) by the first metal plate 21, thus preventing deposition of a thin film on the dielectric ring 22. Thus, the same effects as the previous embodiments can be obtained in this third embodiment.

Preferably, the diameter $2R_1$ of the first metal plate 12 is 1 to 1.5 times larger than the diameter $2R_3$ of the substrate electrode 7 and the diameter $2R_2$ of the second metal plate 13 is 1.6 to 3 times larger than the diameter $2R_3$ of the substrate electrode 7. Within such a range, it becomes possible to form doughnut-shaped high-density plasma in the region outside the dielectric cylinder 5 or dielectric plate 21, and to realize uniform plasma density in the vicinity of the substrate 8 through diffusion. If the diameter $2R_1$ of the first metal plate 12 is smaller than the diameter $2R_3$ of the substrate electrode 7, a resultant plasma distribution would be convex in the vicinity of the substrate 8. Conversely, if the diameter $2R_1$ of the first metal plate 12 is larger than 1.5 times the diameter $2R_3$ of the substrate electrode 7, a resultant plasma distribution would be concave in the vicinity of the substrate 8. Further, if the diameter $2R_2$ of the second metal plate 13 is smaller than 1.6 times the diameter $2R_3$ of the substrate electrode 7, enough plasma density could not be obtained in peripheries of the substrate 8. Conversely, if the diameter $2R_2$ of the second metal plate 13 is larger than 3 times the diameter $2R_3$ of the substrate electrode 7, excessive plasma density would result in peripheries of the substrate 8.

Preferably, a distance $H_1$ between the first metal plate 12 and the substrate electrode 7 is 40 mm to 150 mm. Within such a range, it becomes possible to form doughnut-shaped high-density plasma in the region outside the dielectric cylinder 5 or dielectric plate 21, and to realize uniform, high-density plasma in the vicinity of the substrate 8 through diffusion. If the distance $H_1$ between the first metal plate 12 and the substrate electrode 7 is smaller than 40 mm, enough diffusion would not be done, resulting a plasma distribution concave in the vicinity of the substrate 8. Conversely, if the distance $H_1$ between the first metal plate 12 and the substrate electrode 7 is larger than 150 mm, excessive diffusion of plasma would occur, resulting in a plasma distribution convex in the vicinity of the substrate 8.

Preferably, the distance of the metal rod or the bolt is 10 mm to 50 mm. If the distance between the adjacent metal rods or the adjacent bolts is smaller than 10 mm, the high-frequency electromagnetic field radiated into the vacuum chamber by the coil would decline in strength, leading to a defect that enough plasma density could not be obtained. Also, if the distance between the adjacent metal rods or the adjacent bolts is larger than 50 mm, the metal rods or the bolts would decline in the function as a faradic shield so that capacitive coupling between the coil and the plasma would be increased. This is unfavorable in that a self-biased potential would occur to the surface of the dielectric cylinder or plate, causing the surface of the dielectric cylinder or plate to be etched.

When the dielectric cylinder or plate is positioned such that the transmission plane of the high-frequency electromagnetic field is partly interrupted by the metal rod or the bolt, in the transmission plate, the ratio of an area of part that is not interrupted by the metal rod or the bolt to the area of the whole dielectric cylinder or plate can be defined as an aperture. The aperture is preferably not less than 50%. If the aperture is smaller than 50%, the high-frequency electromagnetic field radiated into the vacuum chamber by the coil would decline in strength, leading to a defect that enough plasma density could not be obtained.

The above embodiments of the present invention have been described with respect to the etching of an iridium film as well as the etching of a silicon oxide film formed on a gold film. However, the present invention is applicable to general plasma processing for processing a substrate or a film on a substrate. Needless to say, etching can be applied to plasma CVD and the like. Moreover, the present invention is useful particularly for the etching of a refractory metal film and the etching of a thin film formed on a refractory metal film. Among such aspects of etching, the method of the present invention is a plasma processing method useful particularly for cases where the refractory metal film is a film containing at least one element of iridium, rhodium, ruthenium, platinum, gold, copper, rhenium, bismuth, strontium, barium, zirconium, lead, and niobium.

As apparent from the above description, according to the etching method of the present invention, while the vacuum chamber is controlled to a specified internal pressure by exhausting the vacuum chamber and simultaneously supplying gas into the vacuum chamber, a high-frequency power of 100 kHz to 100 MHz is applied to a coil provided inside a dielectric window such as a dielectric cylinder or plate provided so as to face a substrate placed on a substrate electrode in the vacuum chamber, by which plasma is generated in the vacuum chamber. Thus, a process such as etching a substrate or a thin film such as a refractory metal film on the substrate by the generated plasma can be performed while particles which tend to move straight from a surface of the substrate or from a surface of the film on the substrate toward a wall surface of the dielectric window inside the vacuum chamber are kept interrupted by a metal plate. Thus, a processing operation such as an etching method that allows a stable processing such as etching rate to be ensured can be realized.

Also, according to the etching method of the present invention, while the vacuum chamber is maintained at a specified internal pressure by exhausting the vacuum chamber and simultaneously supplying gas into the vacuum chamber, a high-frequency power of 100 kHz to 100 MHz is applied to a coil provided inside a dielectric window such as a dielectric cylinder or plate provided so as to face a substrate placed on a substrate electrode in the vacuum chamber, by which plasma is generated in the vacuum chamber. Therefore, a process such as etching a thin film formed on a refractory metal film on the substrate by the generated plasma can be performed while particles which tend to move straight from a surface of the substrate or from a surface of the film on the substrate toward a wall surface of the dielectric window inside the vacuum chamber are kept interrupted by a metal plate. Thus, processing such as an etching method that allows a stable processing such as etching rate to be ensured can be realized.

Also, according to the etching apparatus of the present invention, the apparatus comprises a vacuum chamber as well as gas supply equipment for supplying gas into the vacuum chamber, exhausting equipment for exhausting the vacuum chamber as well as a pressure-controlling valve for maintaining the vacuum chamber at a specified internal pressure, a substrate electrode for placing thereon a substrate in the vacuum chamber, a dielectric window such as a dielectric cylinder or plate provided so as to face the substrate electrode, and a coil provided inside the dielectric window such as a dielectric cylinder or plate as well as a high-frequency power supply capable of supplying a high-frequency power of 100 kHz to 100 MHz to the coil. Thus, processing such as an etching apparatus that allows a stable processing such as etching rate to be ensured can be realized.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A plasma processing method comprising:
   exhausting an interior of a vacuum chamber while supplying gas into the vacuum chamber; and
   while maintaining the interior of the vacuum chamber at a desired pressure, applying high-frequency power in a range of 100 kHz to 100 MHz to a coil at a dielectric window so as to generate plasma in the vacuum chamber to process an object within the vacuum chamber using the generated plasma, wherein a solid metal plate is arranged between the dielectric window and the object so as to reduce deposition of particles on the dielectric window.

2. The plasma processing method of claim 1, wherein the coil is located at an outer surface of the dielectric window, the metal plate being arranged such that any straight line connecting an arbitrary point located on an inner surface of the dielectric window opposite the outer surface and an arbitrary point on a surface of the object is intersected by the metal plate.

3. The plasma processing method of claim 2, wherein the metal plate has at least a portion without any through-holes, the metal plate being arranged so that the portion without any through-holes intersects any straight line connecting an arbitrary point located on the inner surface of the dielectric window opposite the outer surface and an arbitrary point on the surface of the object.

4. The plasma processing method of claim 1, wherein the metal plate is shaped and arranged so that particles emitted from a surface of the object toward the dielectric window are blocked by the metal plate.

5. The plasma processing method of claim 4, wherein the metal plate is shaped and arranged so that particles traveling in a straight line directly from a surface of the object toward an inner surface of the dielectric window are completely blocked by the metal plate.

6. The plasma processing method of claim 1, wherein the metal plate is solid without any through-holes.

7. The plasma processing method of claim 1, wherein the dielectric window is arranged on a surface of the metal plate.

8. The plasma processing method of claim 1, wherein the dielectric window forms a portion of an outer wall of the vacuum chamber.

9. The plasma processing method of claim 1, wherein the dielectric window is arranged so as to face the object.

10. The plasma processing method of claim 1, wherein the dielectric window comprises a dielectric cylinder, said applying of the high-frequency power comprising applying the high-frequency power to the coil located inside the dielectric cylinder and outside of the vacuum chamber.

11. The plasma processing method of claim 10, wherein the metal plate comprises a first metal plate, the dielectric cylinder being fixed between the first metal plate located at a bottom portion of the dielectric cylinder and inside the vacuum chamber and a second metal plate located at an upper portion of the dielectric cylinder opposite the bottom portion by a metal fastener extending through a penetration hole formed along an axis of the dielectric cylinder.

12. The plasma processing method of claim 11, wherein said applying of the high-frequency power comprises applying the high-frequency power while the metal fastener, the first metal plate, and the second metal plate are at a ground potential.

13. The plasma processing method of claim 11, further comprising placing the object on a substrate electrode within the vacuum chamber prior to said applying of the high-frequency power, wherein a diameter of the first metal plate is 1.0 to 1.5 times as large as a diameter of the substrate electrode, and a diameter of the second metal plate is 1.6 to 3.0 times as large as the diameter of the substrate electrode.

14. The plasma processing method of claim 11, further comprising placing the object on a substrate electrode within the vacuum chamber prior to said applying of the high-frequency power, wherein a distance between the first metal plate and the substrate electrode is in a range of 40 mm to 150 mm.

15. The plasma processing method of claim 10, wherein the metal plate comprises a first metal plate, the dielectric cylinder being fixed between the first metal plate located at a bottom portion of the dielectric cylinder and inside the vacuum chamber and a second metal plate located at an upper portion of the dielectric cylinder opposite the bottom portion by a metal fastener located outside of the vacuum chamber.

16. The plasma processing method of claim 15, wherein said applying of the high-frequency power comprises applying the high-frequency power while the metal fastener, the first metal plate, and the second metal plate are at a ground potential.

17. The plasma processing method of claim 15, further comprising placing the object on a substrate electrode within the vacuum chamber prior to said applying of the high-frequency power, wherein a diameter of the first metal plate is 1.0 to 1.5 times as large as a diameter of the substrate electrode, and a diameter of the second metal plate is 1.6 to 3.0 times as large as the diameter of the substrate electrode.

18. The plasma processing method of claim 15, further comprising placing the object on a substrate electrode within the vacuum chamber prior to said applying of the high-frequency power, wherein a distance between the first metal plate and the substrate electrode is in a range of 40 mm to 150 mm.

19. The plasma processing method of claim 1, wherein said processing of the object within the vacuum chamber comprises etching one of a substrate or a film on the substrate.

20. The plasma processing method of claim 1, wherein said processing of the object within the vacuum chamber comprises etching a refractory metal film on a substrate.

21. The plasma processing method of claim 20, wherein the refractory metal film comprises a film containing at least one of iridium, rhodium, ruthenium, platinum, gold, copper, rhenium, bismuth, strontium, barium, zirconium, lead, and niobium.

22. The plasma processing method of claim 1, wherein said processing of the object within the vacuum chamber comprises etching a film formed on a refractory metal film on a substrate.

23. The plasma processing method of claim 1, wherein said maintaining of the interior of the vacuum chamber at a desired pressure comprises maintaining the interior of the vacuum chamber at a pressure no greater than 10 Pa.

24. The plasma processing method of claim 1, wherein said maintaining of the interior of the vacuum chamber at a desired pressure comprises maintaining the interior of the vacuum chamber at a pressure no greater than 3 Pa.

25. An etching method comprising:
  maintaining an interior of a vacuum chamber at a desired pressure by exhausting the vacuum chamber while supplying gas into the vacuum chamber; and
  applying a high-frequency power of 100 kHz to 100 MHz to a coil located inside a dielectric cylinder and outside the vacuum chamber and arranged so as to face a substrate placed on a substrate electrode in the vacuum chamber so as to generate plasma in the vacuum chamber to thereby etch a refractory metal film on the substrate, the dielectric cylinder being fixed between a first metal plate located at a bottom portion of the dielectric cylinder facing the substrate and a second metal plate located at an upper portion of the dielectric cylinder not facing the substrate by a metal fastener extending through a penetration hole formed along an axis of the dielectric cylinder.

26. The etching method of claim 25, wherein the refractory metal film is a film containing at least one element of iridium, rhodium, ruthenium, platinum, gold, copper, rhenium, bismuth, strontium, barium, zirconium, lead, and niobium.

27. The etching method of claim 25, wherein said applying of the high-frequency power comprises applying the high-frequency power while the metal fastener, the first metal plate, and the second metal plate are at a ground potential.

28. An etching method comprising:

maintaining an interior of a vacuum chamber at a desired pressure by exhausting the vacuum chamber while supplying gas into the vacuum chamber; and applying a high-frequency power of 100 kHz to 100 MHz to a coil located inside a dielectric cylinder and outside the vacuum chamber and arranged so as to face a substrate placed on a substrate electrode in the vacuum chamber so as to generate plasma in the vacuum chamber to thereby etch a refractory metal film on the substrate, the dielectric cylinder being fixed between a first metal plate located at a bottom portion of the dielectric cylinder facing the substrate and a second metal plate located at an upper portion of the dielectric cylinder not facing the substrate by a metal fastener arranged in a space inside of the dielectric cylinder.

29. The etching method of claim 28, wherein the refractory metal film is a film containing at least one element of iridium, rhodium, ruthenium, platinum, gold, copper, rhenium, bismuth, strontium, barium, zirconium, lead, and niobium.

30. The etching method of claim 28, wherein said applying of the high-frequency power comprises applying the high-frequency power while the metal fastener, the first metal plate, and the second metal plate are at a ground potential.

* * * * *